United States Patent
Liu et al.

(10) Patent No.: US 10,553,810 B2
(45) Date of Patent: Feb. 4, 2020

(54) OLED DISPLAY PANEL AND AN ELECTRONIC DEVICE COMPRISING THE SAME

(71) Applicant: SHANGHAI TIANMA AM-OLED CO., LTD., Shanghai (CN)

(72) Inventors: Ying Liu, Shanghai (CN); Xiangcheng Wang, Shanghai (CN); Hongyang Ren, Shanghai (CN); Yuji Hamada, Shanghai (CN); Wei He, Shanghai (CN); Chen Liu, Shanghai (CN); Jie Li, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 255 days.

(21) Appl. No.: 15/672,320

(22) Filed: Aug. 9, 2017

(65) Prior Publication Data
US 2017/0358768 A1 Dec. 14, 2017

(30) Foreign Application Priority Data
Mar. 3, 2017 (CN) .......................... 2017 1 0123686

(51) Int. Cl.
*H01L 51/50* (2006.01)
*H01L 51/52* (2006.01)
(Continued)

(52) U.S. Cl.
CPC .......... *H01L 51/5203* (2013.01); *H01L 27/32* (2013.01); *H01L 51/0052* (2013.01);
(Continued)

(58) Field of Classification Search
None
See application file for complete search history.

(56) References Cited

U.S. PATENT DOCUMENTS

| 2003/0170491 A1* | 9/2003 | Liao | H01L 51/5036 |
| | | | 428/690 |
| 2009/0142618 A1* | 6/2009 | Begley | C09K 11/06 |
| | | | 428/690 |
| 2017/0279064 A1* | 9/2017 | Wallikewitz | H01L 51/5052 |

FOREIGN PATENT DOCUMENTS

| CN | 101356663 A | 1/2009 |
| CN | 103594659 A | 2/2014 |
| CN | 106866660 A | 6/2017 |

* cited by examiner

*Primary Examiner* — Gregory D Clark
(74) *Attorney, Agent, or Firm* — Kilpatrick Townsend & Stockton, LLP

(57) ABSTRACT

The present disclosure relates to an OLED display panel, comprising a first electrode and a second electrode, a light emitting layer and a first auxiliary light emitting layer disposed between the first electrode and the second electrode, the first auxiliary light emitting layer is disposed between the light emitting layer and the second electrode, wherein the first auxiliary light emitting layer includes at least a first electron-type auxiliary light emitting layer, wherein the first electron-type auxiliary light emitting layer includes a host material and a metal element doped in the host material; the host material has at least one pyridyl group and an aromatic group conjugated to the at least one pyridyl group; and the glass transition temperature of the host material is ≥90° C. The present disclosure can improve the luminous efficiency and lifetime of an organic photoelectronic device and reduce its voltage by using this method.

17 Claims, 4 Drawing Sheets

(51) Int. Cl.
*H01L 51/00* (2006.01)
*H01L 27/32* (2006.01)
*H01L 51/56* (2006.01)
(52) U.S. Cl.
CPC ...... *H01L 51/0054* (2013.01); *H01L 51/0067* (2013.01); *H01L 51/0072* (2013.01); *H01L 51/56* (2013.01); *H01L 51/5012* (2013.01)

OLED DISPLAY PANEL AND AN ELECTRONIC DEVICE COMPRISING THE SAME

CROSS-REFERENCE TO RELATED APPLICATIONS

The application claims the benefit of the earlier filing date of C.N. Patent Application No. 201710123686.7, filed on Mar. 3, 2017, the contents of which are incorporated by reference herein in its entirety.

TECHNICAL FIELD

The present disclosure relates to the field of organic electroluminescence, and more particularly to an OLED display panel and an electronic device comprising the same.

BACKGROUND

With the advent of information era, conventional cathode ray tube (CRT) displays are being replaced by flat panel displays. Currently, one of the most widely used flat panel displays is liquid crystal displays (LCDs). LCDs have the characteristics of low power consumption and light weight, however, due to the LCDs are not self-luminous, there are technical limitations in terms of contrast, viewing angle and area and size. The organic light emitting diodes (OLEDs) have the characteristics of self-luminous, wide viewing angle, short response time, high luminous efficiency, wide color gamut, low operation voltage, thin panel, and can be used for making large-size and bendable displays so that much attention has been paid thereto.

The existing OLED display device (as shown in FIG. 1) mainly comprises a substrate, and a light emitting unit formed on the substrate which is composed of a transparent anode 7, a cathode 1 composed of alloys and a series of organic thin layers sandwiched between the anode 7 and the cathode 1, the organic thin layer is generally divided according to the function and generally comprises a hole injection layer (HIL) 6, a hole transport layer (HTL) 5, an electron transport layer (ETL) 3, and an electron injection layer (EIL) 2 in sequence from the anode side. Some devices further include a hole blocking layer (HBL) and an electron blocking layer (EBL) as required.

Since the electron transport rate of most organic materials is much smaller than the hole transport rate, it has been one of the main topic of research in the industry to find an ETL whose electron mobility is comparable with the hole mobility of a HTM and which can improve its efficiency and reduce the voltage, with other conditions being satisfied.

SUMMARY

In view of the deficiencies in the related technics, the first object of the present disclosure is to provide an OLED display panel, which comprises a first electrode and a second electrode, a light emitting layer and a first auxiliary light emitting layer disposed between the first electrode and the second electrode, the first auxiliary light emitting layer is disposed between the light emitting layer and the second electrode, wherein the first auxiliary light emitting layer includes at least a first electron-type auxiliary light emitting layer, and the first electron-type auxiliary light emitting layer includes a host material and a rare earth metal element doped in the host material; the host material has at least one pyridyl group

and an aromatic group conjugated to the at least one pyridyl group;
and the glass transition temperature of the host material is ≥90° C.

The second object of the present disclosure is to provide an electronic device comprising an OLED display panel as described in the first object of the present disclosure.

Compared with the related technics, the present disclosure has the following beneficial effects:
in the present disclosure, a specific host doping material is selected and doped with a metal element in a way of host-guest doping to obtain an electron-type auxiliary light emitting layer with a balanced electron transport rate and hole transport rate, thereby improving the luminous efficiency of the device, and reducing the voltage; the host material has at least one pyridyl group

and an aromatic group conjugated to the at least one pyridyl group, the occurring region of electrons of the bonded metal element can be expanded by the nitrogen element contained therein and the formed conjugated π-bond electron cloud, thereby improving the transport rate of electrons and the abilities of electron injection and transport, and increasing the luminous efficiency and lifetime of the organic photoelectronic device and reducing its voltage by using this method.

In addition, the glass transition temperature of 90° C. or more can reduce the decay of the OLED device during operation and improve the stability of the device.

DETAILED DESCRIPTION

Specific Embodiments

For the purpose of understanding the present invention, the following examples are listed below in the present disclosure. It will be apparent to those skilled in the art that these examples are merely illustration and should not be construed as specific limitations to the present invention.

Figure 1:
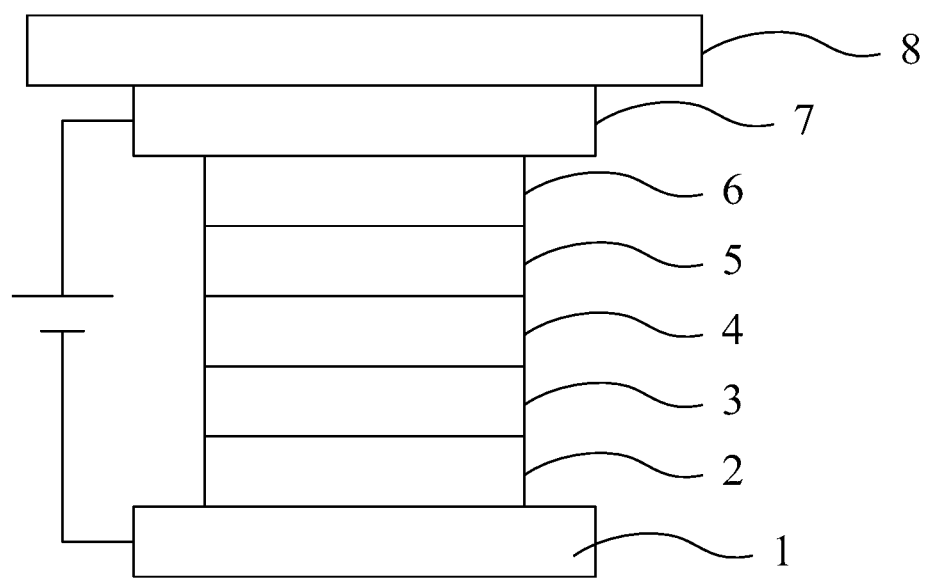
FIG. 1 is a structural representation of the existing OLED display device.
Figure 2:
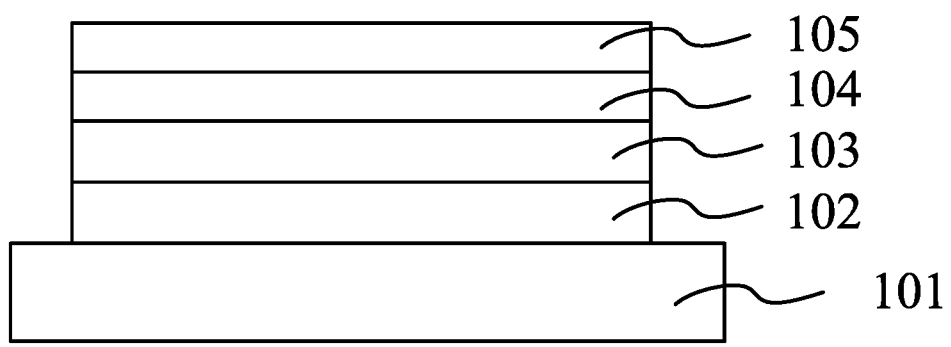
FIG. 2 is a cross-sectional structural representation of an OLED display panel provided in an embodiment of the present disclosure.

In an embodiment, an OLED display panel is provided, referring to FIG. 2, which comprises a substrate 101, and a first electrode 102 and a second electrode 105 disposed on the substrate 101, wherein, a light emitting layer 103 and a first auxiliary light emitting layer 104 are disposed between the first electrode 102 and the second electrode 105, and the first auxiliary light emitting layer 104 is disposed between the light emitting layer 103 and the second electrode 105. The first auxiliary light emitting layer 104 includes at least a first electron-type auxiliary light emitting layer. The first electron-type auxiliary light emitting layer includes a host material and a metal element doped in the host material.

The host material has at least one pyridyl group

and an aromatic group conjugated to the at least one pyridyl group.

The host material has a glass transition temperature ≥90° C., for example, 91° C., 92° C., 94° C., 97° C., 99° C., 101° C., 105° C., 108° C., 113° C., 115° C., and 118° C., etc.

In accordance to the present disclosure, a specific host doping material is selected, the host material has at least one pyridyl group

and an aromatic group conjugated to the at least one pyridyl group, the nitrogen atom on the pyridyl group forms an electron cloud with the outer electrons of the metal element, which expands the range of the occurring region of the electrons under the action of pyridine ring and the large π-bond of the conjugated ring, thereby improving the transport rate of electrons and the abilities of electron injection and transport, and increasing the luminous efficiency and lifetime of the organic photoelectronic device and reducing its voltage by using this method.

In addition, the glass transition temperature of 90° C. or more can ensure that the material is not easy to crystallize during the coating process, which can guarantee the stability of the device, good film forming property, and reduce the decay of the OLED device during operation and improve the stability of the device. Exemplarily, the main structure having a glass transition temperature of 120° C. or more has higher rigidity and is not easy to crystallize during the coating process, which can guarantee good film forming property, and reduce the decay of the OLED device during operation and improve the stability of the device.

It should be noted that the first auxiliary light emitting layer 104 may have a multilayer structure, and may further include an electron injection layer and a hole blocking layer in addition to the first electron-type auxiliary light emitting layer playing the electron transport role. The first electron-type auxiliary light emitting layer can be understood in an embodiment shown in FIG. 2 as an electron transport layer.

Figure 3:
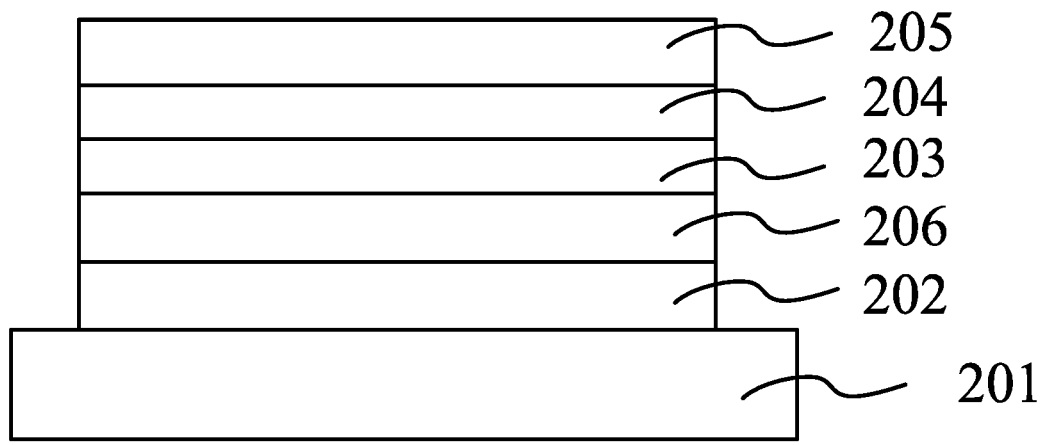
FIG. 3 is a cross-sectional structural representation of an OLED display panel provided in an embodiment of the present disclosure.

In another embodiment, referring to FIG. 3, the OLED display panel exemplarily has a structure as shown in FIG. 3, which comprises a substrate 201, a first electrode 202 disposed on the substrate 201, a second auxiliary light emitting layer 206, a light emitting layer 203, a first auxiliary light emitting layer 204, and a second electrode 205 sequentially laminated on the first electrode 202. The second auxiliary light emitting layer 206, which is disposed at the side of the light emitting layer 203 that is away from the first auxiliary light emitting layer 204, plays the role of hole injection and/or hole transport. The second auxiliary light emitting layer 206 may have a multilayer structure, and may include a hole injection layer, a hole transport layer, and an electron blocking layer. The hole injection layer in the second auxiliary light emitting layer 206 exemplarily includes molybdenum oxide, vanadium oxide, ruthenium oxide, tungsten oxide and manganese oxide, and the like, and may further include phthalocyanine-based compounds such as phthalocyanine, copper phthalocyanine, and the like, and may also include a polymer material such as poly (ethylene dioxythiophene)/poly(styrene sulfonic acid), and the like. The hole transport layer in the second auxiliary light emitting layer 206 can be exemplarily selected from

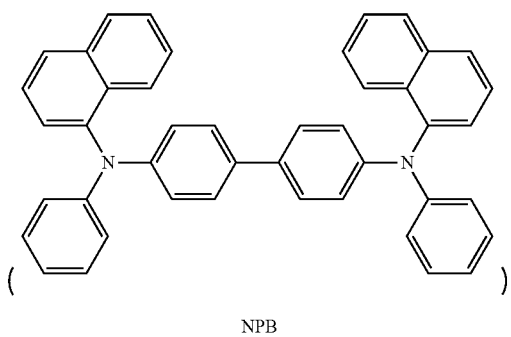

NPB and/or

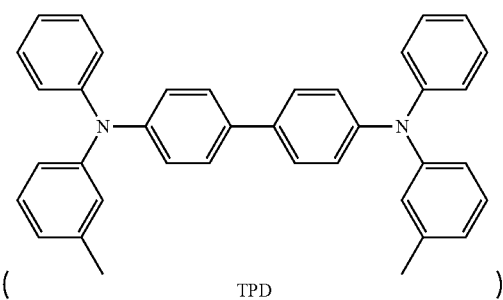

TPD

The first auxiliary light emitting layer, the light emitting layer, and the second auxiliary light emitting layer of the organic light emitting display panel are generally formed by an evaporation way, and can also be obtained by a known film forming method such as sputtering, spin coating, dipping and ion plating, and the like. Since the electrons and holes are injected from the first electrode and the second electrode into the light emitting material layer of the organic light emitting display panel, respectively, and when the excitons obtained by recombination of electrons and holes injected therein are transitioned from the excited state to the ground state, the organic light emitting display panel emits light.

In an embodiment, the host material has at least one pyridyl group

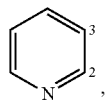

and a conjugated ring sharing carbon atoms at positions 2 and 3 with the at least one pyridyl group.

When the host material has at least one pyridyl group

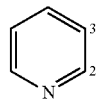

and a conjugated ring sharing carbon atoms at positions 2 and 3 with the at least one pyridyl group, as the pyridyl group and the conjugated ring share a bond through the 2-position and the 3-position, compared with the connection through a single bond, such structure has a larger electron cloud distribution area, and can provide a faster transport channel for electron transport and further improve the electron transport rate as well as the ability of electron injection and transport.

In an embodiment, the host material has a structure of formula (A):

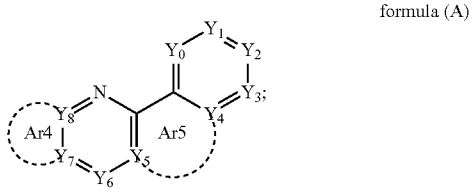

formula (A)

in formula (A), $Y_0$ is selected from N or unsubstituted —CH; $Y_6$ is selected from C having the following substituent: a substituted or unsubstituted C1-C20 alkyl group, a substituted or unsubstituted C1-C20 heteroalkyl group, a substituted or unsubstituted C6-C40 aryl group, or a substituted or unsubstituted C5-C40 heteroaryl group; $Y_1$, $Y_2$, $Y_3$, $Y_4$, $Y_5$, $Y_7$, and $Y_8$ are independently and optionally selected from any one of N, unsubstituted C or C having the following substituent: any one of halogen, —CN, —CH$_3$, —COOR$_1$, —COR$_2$,

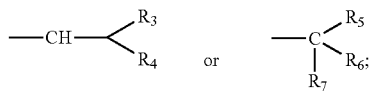

wherein, $R_1$, $R_2$, $R_3$, $R_4$, $R_5$, and $R_6$ are each independently and optionally selected from any one of a substituted or unsubstituted C1-C20 alkyl, a substituted or unsubstituted C3-C20 cycloalkyl, a substituted or unsubstituted C6-C40 aryl, a substituted or unsubstituted C5-C40 heteroaryl group, a substituted or unsubstituted C1-C20 alkoxy group, or a substituted or unsubstituted C6-C40 aryloxy group; $Ar_5$ is absent or selected from any substituted or unsubstituted conjugated ring;

$Ar_4$ is absent or selected from any substituted or unsubstituted conjugated ring.

In the compound of formula (A), $Y_6$ has a substituent, which can increase the molecular weight and play a role in increasing the glass transition temperature of the material. In addition, in formula (A), the nitrogen atom and $Y_0$ work together with the metal atom to further expand the occurring range of the electrons of the metal atom, so that the electrons can move in a larger range, thereby improving the ability of electron injection and transport when being used as the host material.

Optionally, the conjugated ring (e.g., $Ar_1$, $Ar_2$, $Ar_3$, $Ar_4$ or $Ar_5$, etc.) of the present disclosure exemplarily includes any one of a substituted or unsubstituted phenyl group, a substituted or unsubstituted pyridyl group, a substituted or unsubstituted pyrrolyl group, a substituted or unsubstituted furyl group, a substituted or unsubstituted thienyl group, a substituted or unsubstituted thiazolyl group, or a substituted or unsubstituted imidazolyl group.

Optionally, in formula A, the substituents for a substituted conjugated ring include: halogen, —CN, —CH$_3$, —COOR$_1$, —COR$_2$,

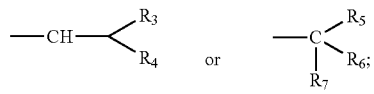

wherein, $R_1$, $R_2$, $R_3$, $R_4$, $R_5$, $R_6$ and $R_7$ are each independently and optionally selected from any one of a substituted or unsubstituted C1-C20 alkyl, a substituted or unsubstituted C3-C20 cycloalkyl, a substituted or unsubstituted C6-C40 aryl, a substituted or unsubstituted C5-C40 heteroaryl group, a substituted or unsubstituted C1-C20 alkoxy group, or a substituted or unsubstituted C6-C40 aryloxy group.

The substituted or unsubstituted C1-C20 alkyl group exemplarily includes methyl, ethyl, propyl, n-butyl, isobutyl, n-pentyl, isopentyl, neopentyl, n-hexyl, n-heptyl, cyclooctyl, nonyl, hexadecyl, octadecyl, and eicosyl, and the like.

The substituted or unsubstituted C3-C20 cycloalkyl group exemplarily includes cyclobutyl, cyclopentyl, cyclohexyl, cycloheptyl, cyclooctyl, cyclononyl, cyclodecyl, cycloundecyl, cyclododecyl, and cyclopentadecyl, and the like.

The substituted or unsubstituted C6-C40 aryl group exemplarily includes phenyl, tolyl, ethylphenyl, xylyl, diphenyl, terphenyl, naphthyl, benzopyrenyl, pyrenyl, and anthryl, and the like.

The substituted or unsubstituted C5-C40 heteroaryl group exemplarily includes pyridyl, pyrrolyl, furyl, thienyl, thiazolyl, imidazolyl, fluorenyl, phenylpropylpyridyl, methylpyridyl, and ethylfuryl, and the like.

The substituted or unsubstituted C1-C20 alkoxy group exemplarily includes methoxy, ethoxy, propoxy, n-butoxy, isobutoxy, n-pentyloxy, isopentyloxy, neopentyloxy, n-hexyloxy, n-heptyloxy, cyclooctyloxy, nonyloxy, hexadecyloxy, octadecyloxy, and eicosyloxy, and the like.

The substituted or unsubstituted C6-C40 aryloxy group exemplarily includes phenoxy, tolyloxy, ethylphenoxy, xylyloxy, biphenoxy, terphenoxy, naphthoxy, benzopyrenyloxy, pyrenyloxy, anthryloxy, pyridyloxy, pyrrolyloxy, furyloxy, thienyloxy, thiazolyloxy, imidazolyloxy, fluorenyloxy, phenylpropylpyridyloxy, methylpyridyloxy, and ethylfuryloxy, and the like.

In an embodiment, in formula (A), $Y_6$ is selected from C having the following substituent: a substituted or unsubstituted C10-C40 aryl, or a substituted or unsubstituted C10-C40 heteroaryl.

Optionally, in formula (A), $Y_6$ is selected from C having the following substituent: any one of a substituted or unsubstituted phenyl, a substituted or unsubstituted diphenyl, a substituted or unsubstituted terphenyl, a substituted or unsubstituted quaterphenyl, a substituted or unsubstituted quinquephenyl, a substituted or unsubstituted naphthyl, a substituted or unsubstituted anthryl, a substituted or unsubstituted phenanthryl, a substituted or unsubstituted indenyl, a substituted or unsubstituted fluorenyl, a substituted or unsubstituted pyrenyl, or a substituted or unsubstituted benzopyrenyl group. When $Y_6$ is selected from the above described range, except that a larger molecular weight and a higher glass transition temperature can be obtained, the π bond can be increased and the occurring range of free electrons can be expanded, thereby improving the abilities of electron injection and transport, and increasing the luminous efficiency and lifetime of the device as well as reducing the voltage.

Optionally, the host material has a structure of formula (I):

formula (I)

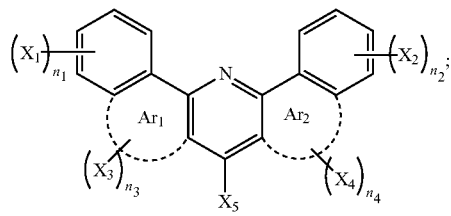

in formula (I), $X_1$, $X_2$, $X_3$, $X_4$, and $X_5$ are each independently selected from hydrogen, halogen, —CN, —CH$_3$, —COOR$_1$, —COR$_2$,

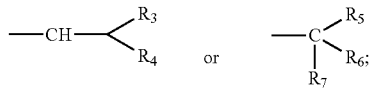

and $X_1$, $X_2$, $X_3$, $X_4$, and $X_5$ include at least one non-hydrogen group; wherein, $R_1$, $R_2$, $R_3$, $R_4$, $R_5$, and $R_6$ are each independently and optionally selected from any one of a substituted or unsubstituted C1-C20 alkyl, a substituted or unsubstituted C3-C20 cycloalkyl, a substituted or unsubstituted C6-C40 aryl, a substituted or unsubstituted C5-C40 heteroaryl group, a substituted or unsubstituted C1-C20 alkoxy group, or a substituted or unsubstituted C6-C40 aryloxy group;

$n_1$, $n_2$, $n_3$, and $n_4$ are each independently selected from a positive integer greater than or equal to 0;

$Ar_1$ and $Ar_2$ are each independently selected from a substituted or unsubstituted aromatic five-membered ring, or a substituted or unsubstituted aromatic six-membered ring.

$Ar_1(Ar_2)$ being selected from "a substituted or unsubstituted aromatic five-membered ring" means that a substituted or unsubstituted aromatic five-membered ring is incorporated between the pyridyl group and the phenyl group.

$Ar_1(Ar_2)$ being selected from "a substituted or unsubstituted aromatic six-membered ring" means that a substituted or unsubstituted aromatic six-membered ring is incorporated between the pyridyl group and the phenyl group.

Figure 4:
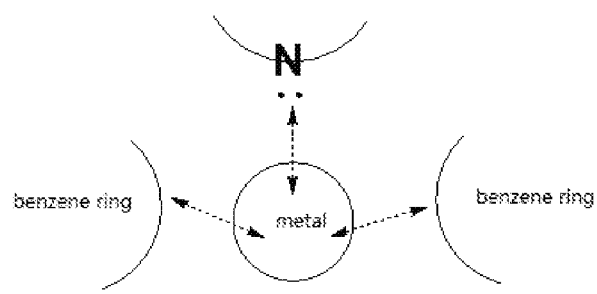
FIG. 4 is a principle schematic diagram of the structure of formula (I).

In formula (I), at least a benzene ring-aromatic ring-pyridine ring-aromatic ring-benzene ring structure is contained from the left to the right, and a U-shaped large 7C bond structure is formed on the side of the nitrogen atom in the pyridine ring, the U-shaped large π bond structure can be better coordinated with the metal elements, and the metal elements can be located inside the U-shaped structure, thus the free electrons can act with the large 7C bond of a structure represented by formula (I) to a greater extent, thereby showing a wider occurring range of electrons to improve the electron transport and injection efficiency and increasing the luminous efficiency and lifetime of the organic photoelectronic device as well as reducing its voltage. The principle schematic diagram is as shown in FIG. 4.

In addition, $X_1$, $X_2$, $X_3$, $X_4$, and $X_5$ in the structure of formula (I) contains at least one non-hydrogen substituent, therefore a higher glass transition temperature can be obtained.

As an optional technical solution, in formula (I) of the present disclosure, $X_1$, $X_2$, $X_3$, $X_4$, and $X_5$ contains at least one substituent selected from the following range: any one of a substituted or unsubstituted phenyl, a substituted or unsubstituted diphenyl, a substituted or unsubstituted terphenyl, a substituted or unsubstituted quaterphenyl, a substituted or unsubstituted quinquephenyl, a substituted or unsubstituted naphthyl, a substituted or unsubstituted anthryl, a substituted or unsubstituted phenanthryl, a substituted or unsubstituted indenyl, a substituted or unsubstituted fluorenyl, a substituted or unsubstituted pyrenyl, or a substituted or unsubstituted benzopyrenyl group. The above described range can expand the π bond and increase the occurring range of free electrons except for obtaining a larger molecular weight and a higher glass transition temperature, thereby improving the abilities of electron injection and transport, and increasing the luminous efficiency and lifetime of the device as well as reducing the voltage.

For the structure of formula (I), the U-shaped large 7C bond has a beneficial effect on the electron injection and transport, whereas in formula (I), for example, the 1-position and 1'-position of the structure represented by formula (I') below preferably have no substituent, if the 1-position and the 1'-position have a substituent, especially a substituent with a larger steric hindrance, it is prone to cause an obstruction to the inner cavity of the U-shaped large π-bond, which prevents the metal atom from being coordinated with the U-shaped large π-bond. For the same reason, it is preferable that the 2-position and 2'-position of the structure represented by formula (I') do not have a substituent or have a substituent with a smaller steric hindrance such as methyl, and ethyl, and the like.

formula (I')

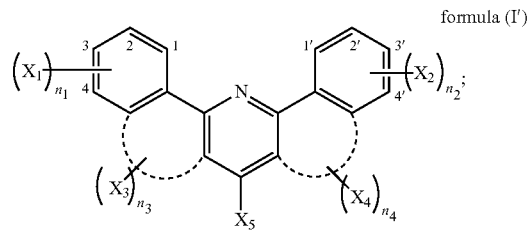

in formula (I'), $X_1$, $X_2$, $X_3$, $X_4$, $X_5$, $n_1$, $n_2$, $n_3$, $n_4$, $Ar_1$ and $Ar_2$ have the same meanings as described for formula (I).

In another optional embodiment, the host material has a structure of formula (II):

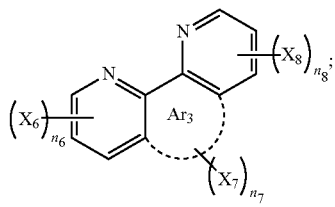

formula (II)

in formula (II), $X_6$, $X_7$, and $X_8$ are each independently selected from hydrogen, halogen, —CN, —CH$_3$, —COOR$_1$, —COR$_2$,

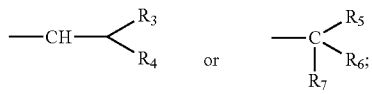

and $X_6$, $X_7$, and $X_8$ include at least one non-hydrogen group; wherein, $R_1$, $R_2$, $R_3$, $R_4$, $R_5$, and $R_6$ are each independently and optionally selected from any one of a substituted or unsubstituted C1-C20 alkyl, a substituted or unsubstituted C3-C20 cycloalkyl, a substituted or unsubstituted C6-C40 aryl, a substituted or unsubstituted C5-C40 heteroaryl group, a substituted or unsubstituted C1-C20 alkoxy group, or a substituted or unsubstituted C6-C40 aryloxy group;
$n_8$, $n_6$, and $n_7$ are each independently selected from a positive integer greater than or equal to 0;
Ar$_3$ is absent or selected from a substituted or unsubstituted aromatic five-membered ring, or a substituted or unsubstituted aromatic six-membered ring.

The expression of "Ar$_3$ is absent" means that the two pyridyl groups of formula (II) are linked with a single bond.

Ar$_3$ being selected from "a substituted or unsubstituted aromatic five-membered ring" means that a substituted or unsubstituted aromatic five-membered ring is incorporated between the two pyridyl groups of formula (II).

Ar$_3$ being selected from "a substituted or unsubstituted aromatic six-membered ring" means that a substituted or unsubstituted aromatic six-membered ring is incorporated between the two pyridyl groups of formula (II).

Figure 5:
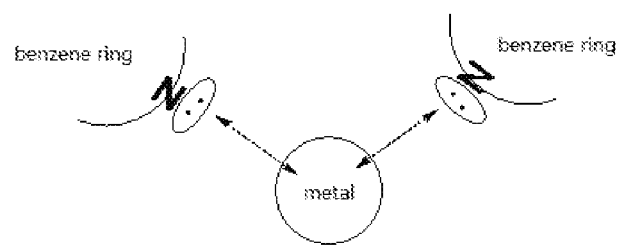
FIG. 5 is a principle schematic diagram of the structure of formula (II).

In formula (II), the two pyridyl groups exist necessarily in a conjugated form and form a large 7C bond, after such structure coordinates with a metal atom, the electrons of the metal atom can have a plurality of channels to bond to the large 7C bond, so as to produce an electron cloud, thereby improving the electron injection and transport rates and increasing the luminous efficiency and lifetime of the organic photoelectronic device as well as reducing its voltage. The above principle schematic diagram is as shown in FIG. 5. In addition, $X_6$, $X_7$, and $X_8$ in the structure of formula (II) contains at least one non-hydrogen substituent, therefore a higher glass transition temperature can be obtained.

As an optional technical solution, in formula (II) of the present disclosure, $X_6$, $X_7$, and $X_8$ contains at least one substituent selected from the following range: any one of a substituted or unsubstituted phenyl, a substituted or unsubstituted diphenyl, a substituted or unsubstituted terphenyl, a substituted or unsubstituted quaterphenyl, a substituted or unsubstituted quinquephenyl, a substituted or unsubstituted naphthyl, a substituted or unsubstituted anthryl, a substituted or unsubstituted phenanthryl, a substituted or unsubstituted indenyl, a substituted or unsubstituted fluorenyl, a substituted or unsubstituted pyrenyl, or a substituted or unsubstituted benzopyrenyl group. The above described range can expand the π bond and increase the occurring range of free electrons except for obtaining a larger molecular weight and a higher glass transition temperature, thereby improving the abilities of electron injection and transport, and increasing the luminous efficiency and lifetime of the device as well as reducing the voltage.

Exemplarily, the host material may include any one or a combination of at least two of

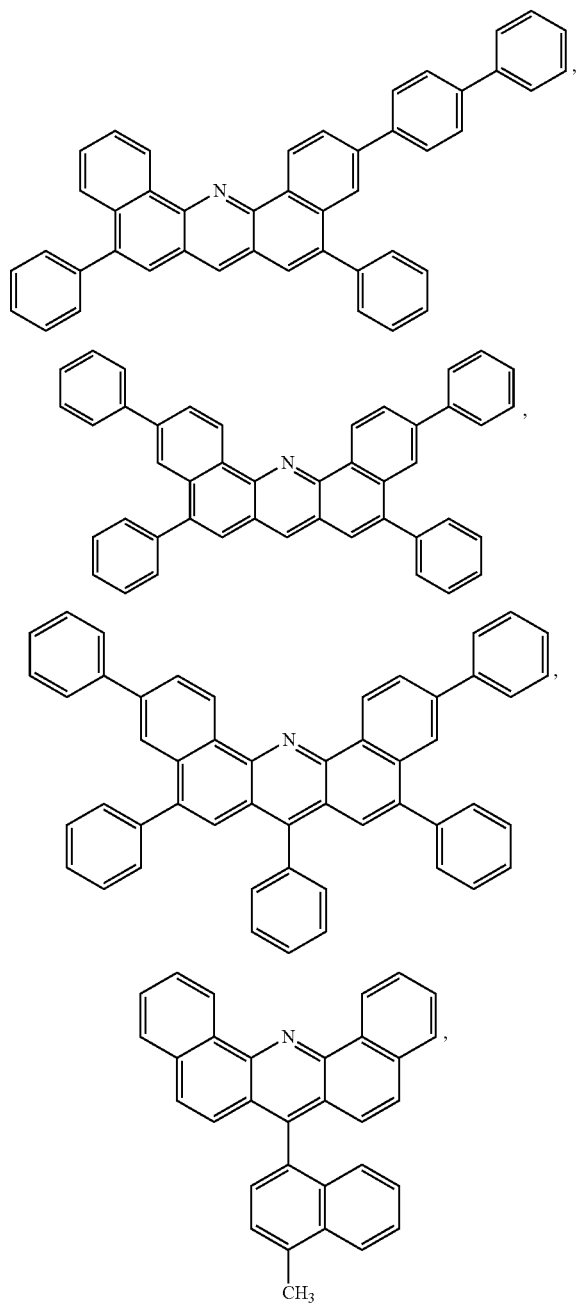

-continued
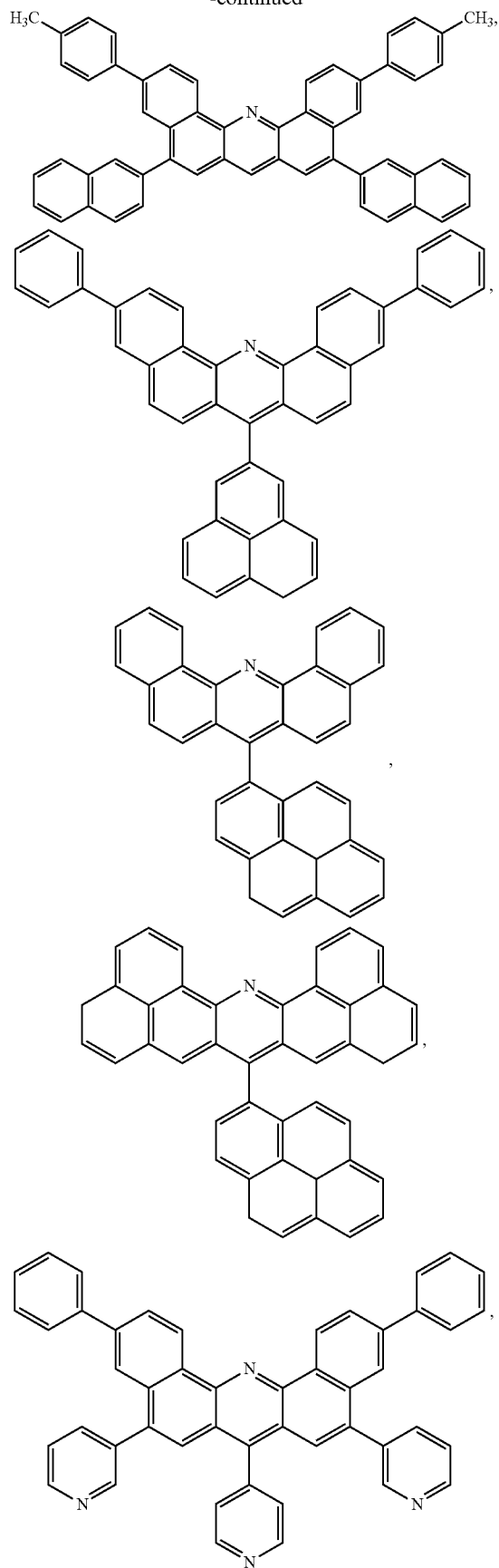
-continued
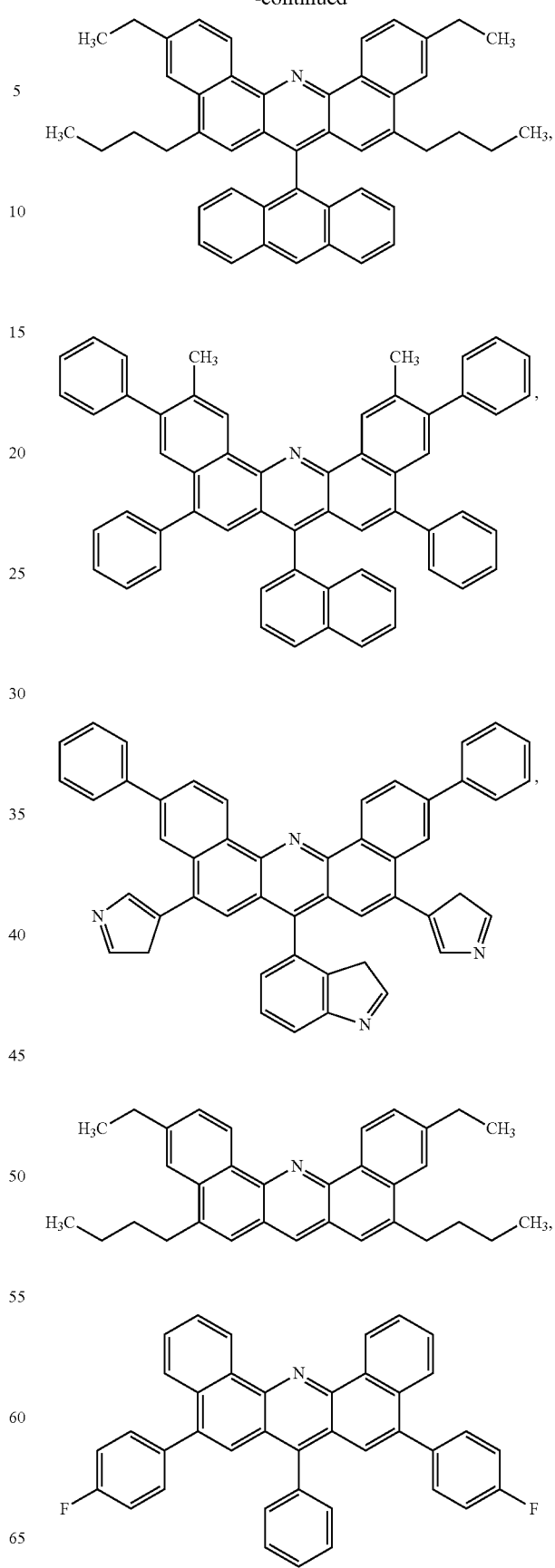

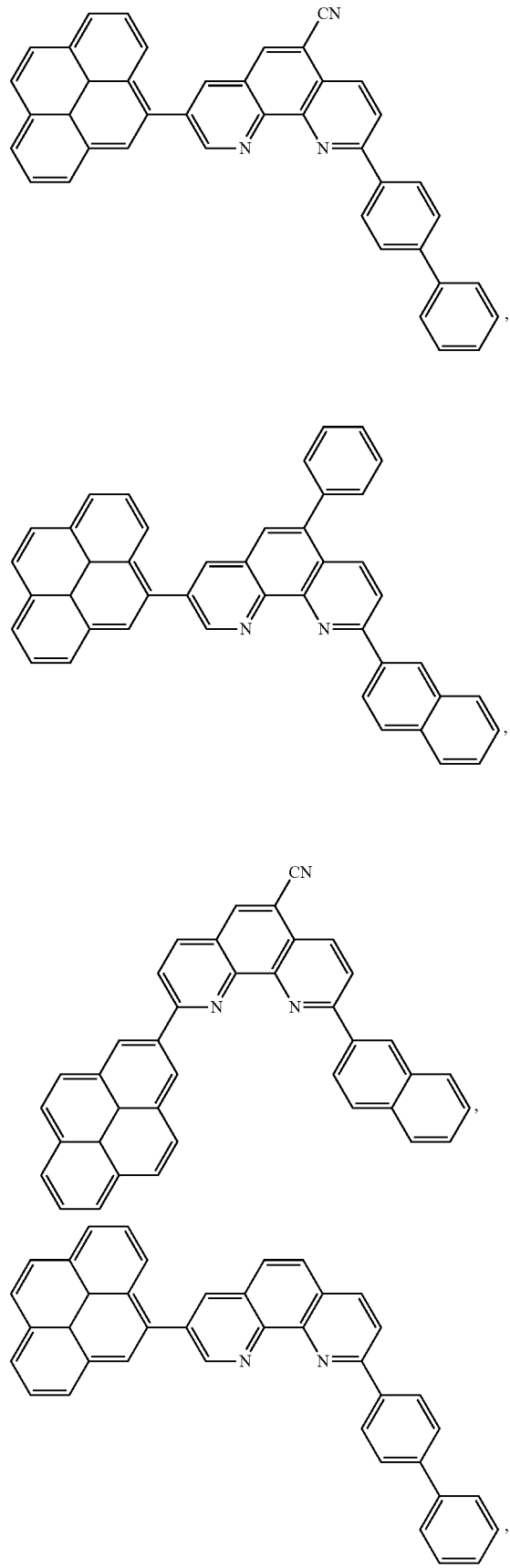

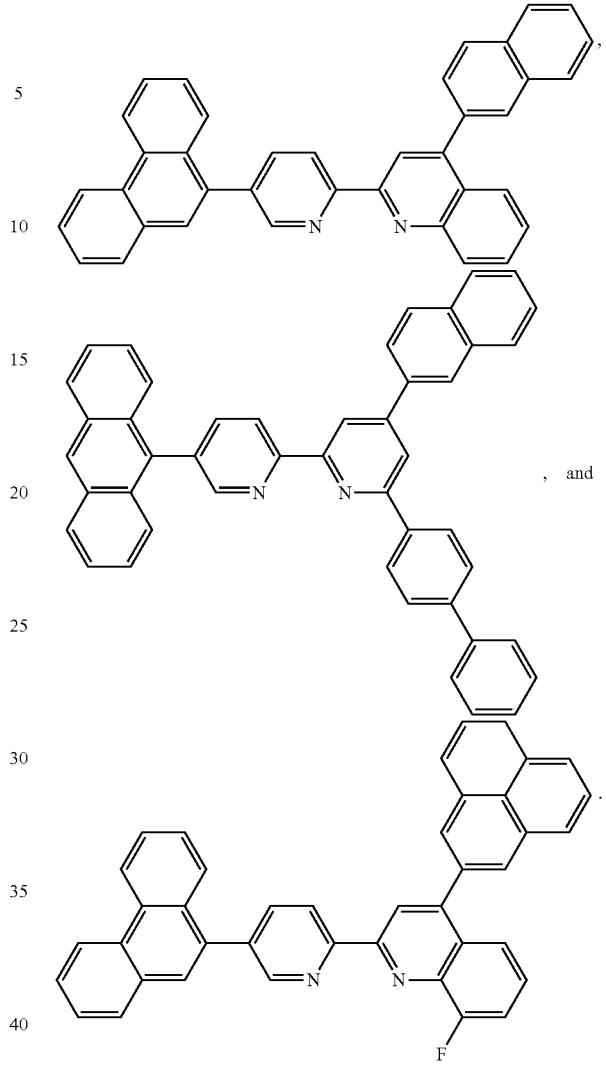

In an embodiment, the metal element of the present disclosure includes an alkali metal element, an alkaline earth metal element and a rare earth metal element. Exemplarily, the metal element includes any one or a combination of at least two of ytterbium, magnesium, lithium, cesium and calcium. Optionally, in the first electron-type auxiliary light emitting layer, the volume ratio of the doped metal element to the host material is 0.1-10%, for example, 0.2 wt %, 0.5 wt %, 0.7 wt %, 0.9 wt %, 1.1 wt %, 1.4 wt %, 1.6 wt %, 1.8 wt %, 2.3 wt %, 2.6 wt %, 2.8 wt %, 3.3 wt %, 3.5 wt %, 3.8 wt %, 4.5 wt %, 5.2 wt %, 6.8 wt %, 7.2 wt %, 7.7 wt %, 8.5 wt %, or 9.5 wt %, and the like. Specifically, the use of a doping ratio of 0.1-10% in the first electron-type auxiliary light emitting layer can obtain a better electron transport property, whereby an electron-type auxiliary light emitting layer having a higher electron mobility can be obtained, so that it can be easier to balance the electron and hole transport rate in the device, and obtain a light emitting device with higher efficiency and lower voltage. If the volume ratio of the doped metal element to the host material is less than 0.1%, the electron mobility of the first electron-type auxiliary light emitting layer is not obviously increased, which will cause an increased square resistance of the device and an unobviously decreased voltage. If the volume ratio of the doped metal element to the host material is more than 10%, the content of the metal element is too much, which will easily cause the exciton quenching in the light emitting layer, thereby greatly reducing the luminous efficiency of the OLED device. Exciton quenching refers to when the interface with which the light emitting layer contacts contains too much metal, the excitons generated in the light emitting layer will be easily affected by the metal at the interface, thereby causing the energy quenching and poor efficiency of the device. Moreover, if the volume ratio of the doped metal element to the host material is more than 10%, the content of the metal element is too much, it may also make too many metal atoms unable to coordinate with the host material, which will also affect the electron cloud distribution of the existing pyridine ring and the conjugated ring, thereby greatly reducing the electron mobility, and being conducive to the reduction of the operation voltage of the device and the improvement of the efficiency of the device.

In another embodiment, in the first electron-type auxiliary light emitting layer, the volume ratio of the doped metal element to the host material is 0.5-5%. Specifically, the use of a doping ratio of 0.5-5% in the first electron-type auxiliary light emitting layer can obtain a better electron transport property, so that it can be easier to balance the electron and hole transport rates in the device.

The first electrode of the present disclosure preferably comprises at least a reflective film and a conductive transparent film. In an embodiment, the reflective film includes silver.

The conductive transparent film may be any one or a combination of at least two of indium tin oxide (ITO), indium zinc oxide (IZO) and tin dioxide.

The second electrode may be exemplarily selected from any one or a combination of at least two of magnesium, aluminum and silver.

In an embodiment, the light emitting layer includes any one or a combination of at least two of a blue light emitting unit, a green light emitting unit, a red light emitting unit, a yellow light emitting unit, and a white light emitting unit. The light emitting layer in the example of the present disclosure may include a host material and a guest dopant. It will be understood by those skilled in the art that the content of the host material in the light emitting layer is greater than that of the guest dopant, generally, the absolute value of the HOMO energy level of the host material |T_host (HOMO)| is greater than that of the HOMO energy level of the guest dopant |T_dopant (HOMO)|, and the absolute value of the LUMO energy level of the host material |T_host (LUMO)| is smaller than that of the LUMO energy level of the guest dopant |T_dopant (LUMO)|, and the triplet energy level of the host material T_host (S) is greater than the triplet energy level of the guest dopant T_dopant (S). The triplet exciton energy of the host material can be effectively transferred to the guest dopant, and the energy of the emission spectrum of the host material can match with that of the absorption spectrum of the guest dopant. Additionally, the light emitting material of the light emitting layer may include a phosphorescent material or a fluorescent material. For example, in an embodiment, a phosphorescent material can be used as the light emitting material of the green light emitting unit and the red light emitting unit; and a fluorescent material can be used as the light emitting material of the blue light emitting unit. The material of the light emitting layer of the present disclosure is not limited, and for example, a non-host guest doping system material or a light emitting material having a thermally activated delayed fluorescence (TADF) function can be used.

In an embodiment, the blue light emitting unit, the green light emitting unit and the red light emitting unit are each independently selected from a manner that a host material is doped with a guest material.

So called "each independently" refers to the selection of the host material and the guest material may be the same or different for the blue light emitting unit, the green light emitting unit, and the red light emitting unit.

In an embodiment, the red light emitting unit includes one or two host materials; the green light emitting unit includes two or more host materials; and the blue light emitting unit includes one or two host materials.

Optionally, the second electrode of the present disclosure can employ any one of magnesium silver alloy, silver metal, silver ytterbium alloy and silver rare-earth metal alloy. An appropriate material for the second electrode is selected according to the specific product requirements, so that the transmittances of the light emitting units for different colors keep balance.

Figure 6:
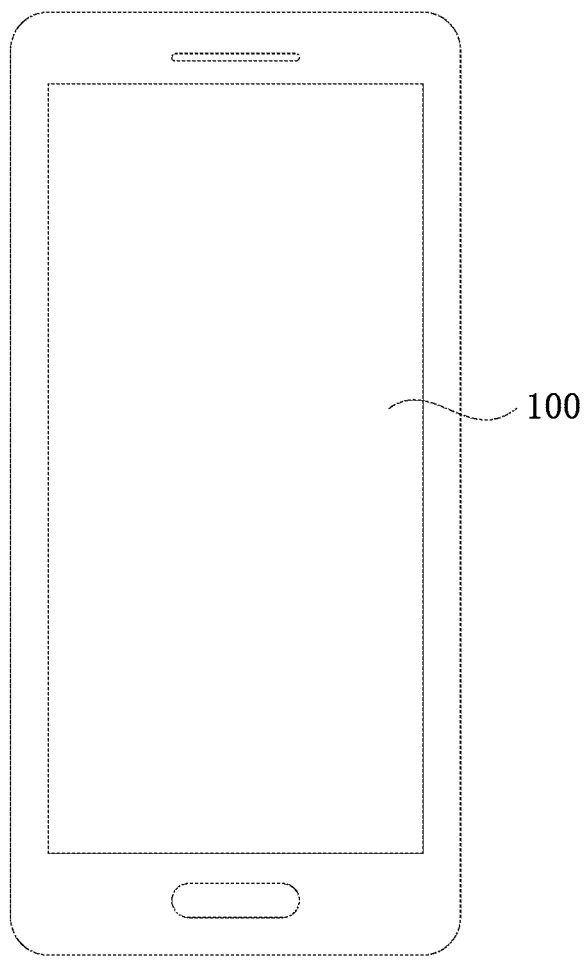
FIG. 6 is a structural representation of an electronic device provided in an example of the present disclosure.

The present disclosure also provides an electronic device, and FIG. 6 is a structural representation of an electronic device provided in an example of the present disclosure. As shown in FIG. 6, the electronic device comprises an OLED display panel 100 according to any one of the above embodiments. The electronic device may be a mobile phone as shown in FIG. 6, and may also be a computer, a television set, and an intelligent wearing device, etc., and the embodiment of the present disclosure is not particularly limited thereto.

The host material in the present disclosure can be obtained by the following synthetic method:
for the structure of formula (I), the synthetic route is exemplified as follows:

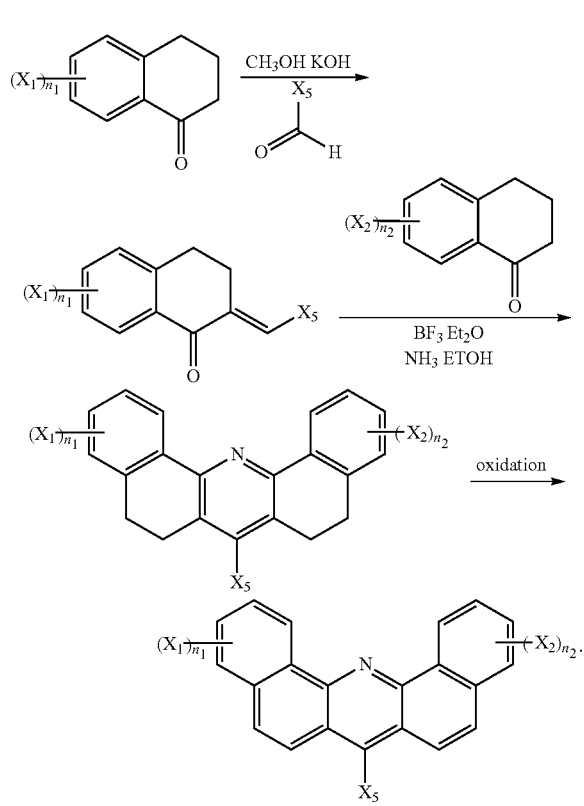

For the structure of formula (II), the synthetic route is exemplified as follows:

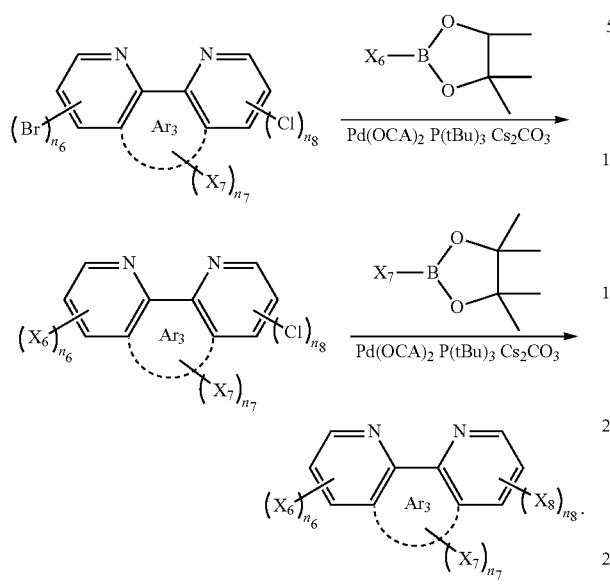

Performance tests for a number of examples and comparative examples provided by the present disclosure are also carried out in the present disclosure, and the test method is as follows:

(1) The glass transition temperature Tg was measured by differential scanning calorimetry;

(2) The currents of the organic photoelectronic devices manufactured according to the test examples and comparative examples at different voltages were tested with a Keithley 2365A digital nanovoltmeter, and then the current densities of the organic photoelectronic devices at different voltages were obtained by dividing the currents by the light emitting area. The luminance and radiant energy flux density of the organic photoelectronic device manufactured according to the test examples and comparative examples at different voltages were tested with a Konicaminolta CS-2000 spectroradiometry luminance meter. According to the current density and luminance of the organic photoelectronic device at different voltages, the current efficiency (Cd/A) and the external quantum efficiency EQE at the same current density (0.1 mA/cm$^2$) were obtained.

Figure 7:
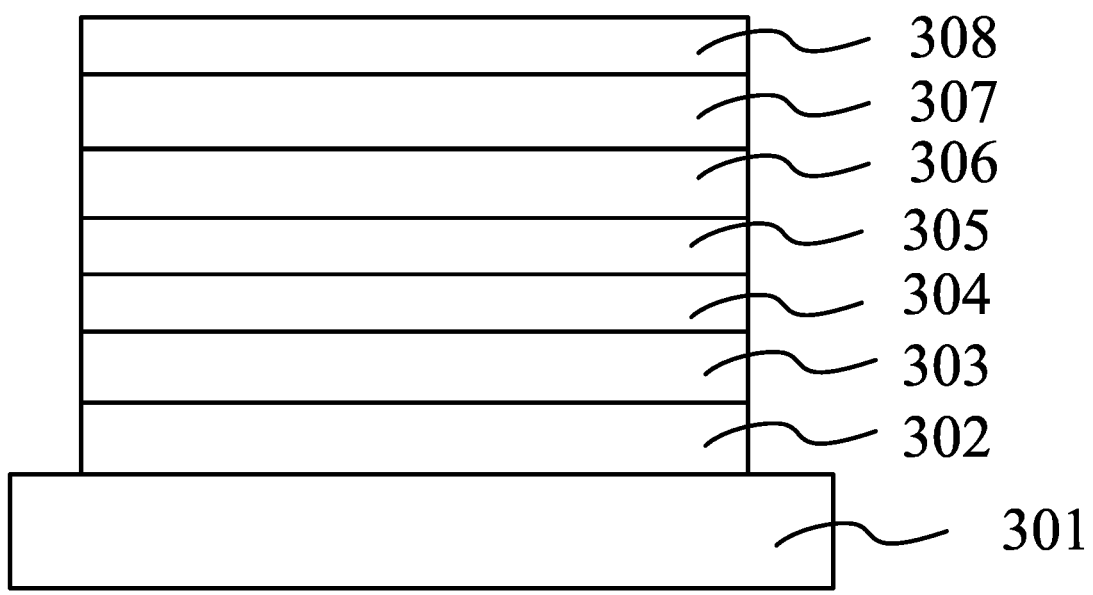
FIG. 7 is a cross-sectional structural representation of the OLED display panels in each example and comparative example when the performance test is carried out in the present disclosure.

In the performance tests, the structures of devices in each example and comparative example were the same, all of which were as shown in FIG. 7, which comprise: a substrate 301, a first electrode 302, a hole injection layer 303, a hole transport layer 304, a light emitting layer 305, an electron transport layer 306, an electron injection layer 307 and a second electrode 308 sequentially laminated on the substrate 301. The electron transport layer 306 in FIG. 7 can be understood as the first electron-type auxiliary light emitting layer in each of the above-described examples. The thickness and the material of the substrate 301, the first electrode 302, the hole injection layer 303, the hole transport layer 304, the light emitting layer 305, and the second electrode 308 in each example and comparative example were also the same, wherein, the first electrode 302 employed an indium zinc oxide material; and the hole injection layer 303 employed a co-doping material of

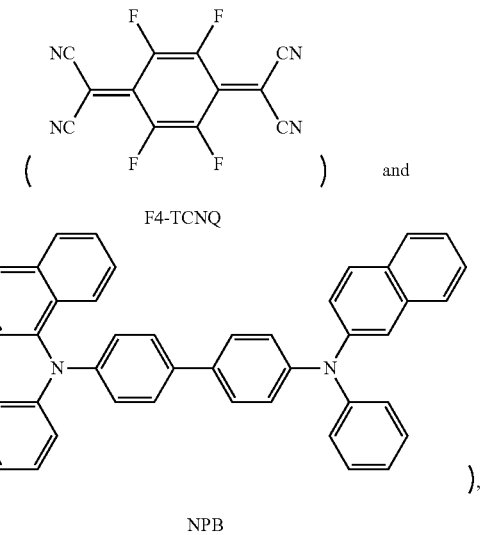

the volume ratio of

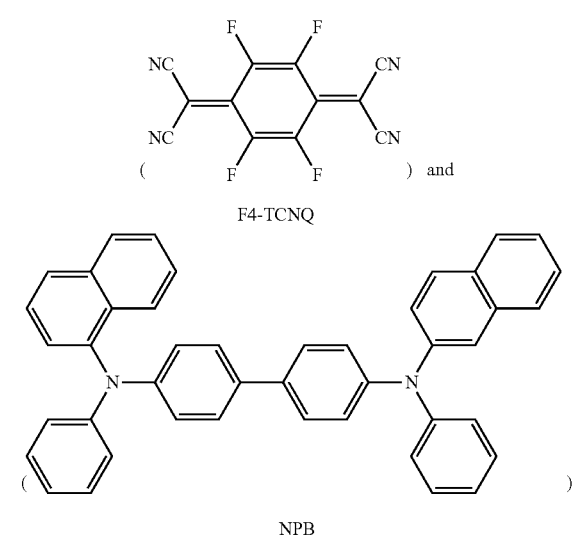

was 1%, the thickness of the hole injection layer 303 was 10 nm; the hole transport layer 304 used

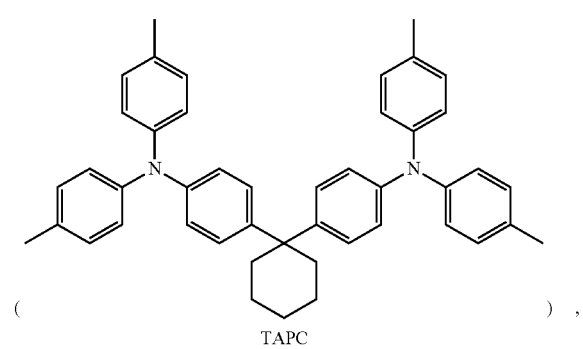

with a thickness of 125 nm; the light emitting layer 305 employed a co-doping material of

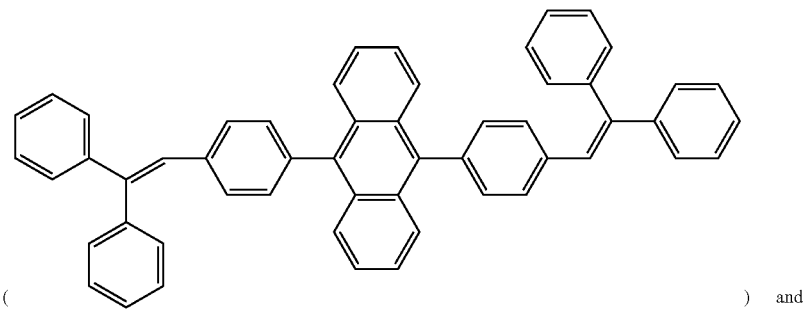
( ) and
DPVBi
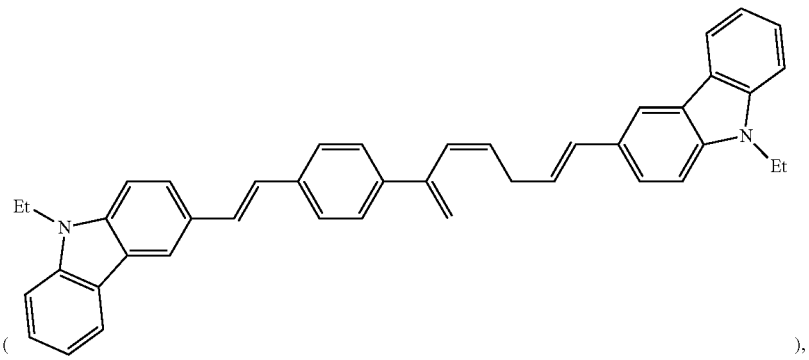
( ),
BCzVBi
the volume ratio of
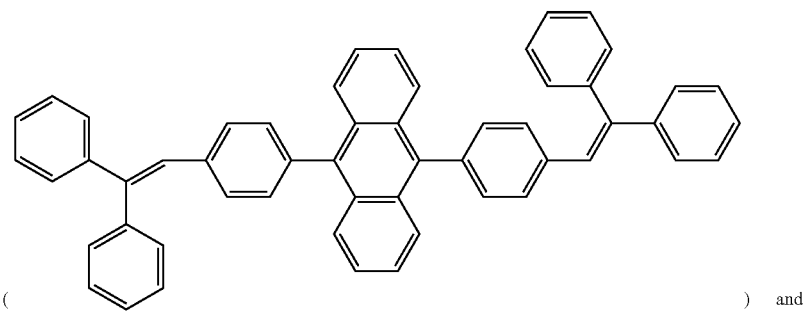
( ) and
DPVBi
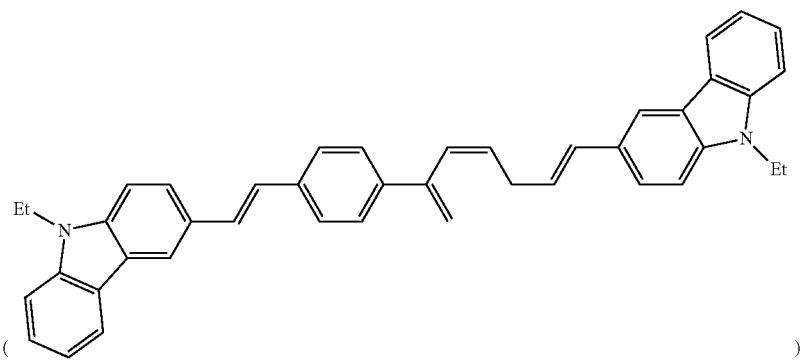
( )
BCzVBi was 5%, the thickness of the light emitting layer 305 was 25 nm; the thickness of the electron transport layer 306 was 10 nm; the thickness of the electron injection layer 307 was 34 nm; and the second electrode 308 employed Ag, with a thickness of 15 nm. The difference between the example and the comparative example only lied in that the selection of the materials for the electron transport layer 306 and the electron injection layer 307 was different, specifically as shown in Table 1 and Table 2.

The test results were as shown in Table 1:

TABLE 1

Table of the test results of the devices in examples and comparative examples

| Examples | Electron injection layer | Electron transport layer | Voltage/V | EQE/% | E/CIE-y |
|---|---|---|---|---|---|
| Example 1 | A2 | A2:LiQ (50%) | 5.05 | 5.00% | 39 |
| Example 2 | A2 | A2:Yb (1%) | 3.85 | 5.38% | 44 |
| Example 3 | A2 | A2:Yb (3%) | 3.78 | 5.20% | 41 |
| Example 4 | A2 | A2:Yb (5%) | 3.83 | 5.15% | 41 |
| Example 5 | A2 | A2:Yb (10%) | 4.00 | 5.00% | 40 |
| Example 6 | A3 | A3:Yb (1%) | 3.82 | 5.40% | 46 |
| Example 7 | A4 | A4:Yb (1%) | 3.80 | 5.34% | 43 |
| Example 8 | A5 | A5:Yb (1%) | 3.58 | 5.39% | 44 |
| Example 9 | A6 | A6:Yb (1%) | 3.83 | 4.45% | 45 |
| Example 10 | A2 | A2:Cs (1%) | 3.95 | 5.40% | 46 |
| Example 11 | A2 | A2:Ca (10%) | 3.85 | 5.34% | 43 |
| Example 12 | A2 | A2:Mg (10%) | 3.79 | 5.28% | 43 |
| Comparative Example 1 | A2 | A2 | 5.82 | 5.10% | 37 |
| Comparative Example 2 | B1 | B1:LiQ (50%) | 6.86 | 4.50% | 30 |
| Comparative Example 3 | B1 | B1:Yb (1%) | 11.51 | 4.20% | 36 |
| Comparative Example 4 | C1 | C1:LiQ (50%) | 6.10 | 5.00% | 29 |
| Comparative Example 5 | C1 | C1:Yb (1%) | 6.70 | 4.70% | 34 |
| Comparative Example 6 | D1 | D1:LiQ (50%) | 5.41 | 4.60% | 33 |
| Comparative Example 7 | D1 | D1:Yb (1%) | 5.05 | 4.82% | 35 |
| Comparative Example 8 | E1 | E1:Yb (1%) | 4.35 | 4.95% | 37 |

In Table 1, the code names for each material were as shown in Table 2:

TABLE 2

Table of structures of materials represented by each code name in the examples and comparative examples

| Code names | Materials |
|---|---|
| A2 | (chemical structure) |
| A3 | (chemical structure) |
| A4 | (chemical structure) |
| A5 | (chemical structure) |
| A6 | (chemical structure) |

TABLE 2-continued

Table of structures of materials represented by each code
name in the examples and comparative examples

| Code names | Materials |
|---|---|
| B1 | (structure with C₂H₅, C₄H₉, C₃H₇ substituents on phenyl-indole) |
| C1 | (carbazole with CH₃, C₃H₇ substituents) |
| D1 | (triazine with phenyl groups and C₂H₅) |
| LiQ | 8-hydroxyquinoline-lithium |
| Yb | Ytterbium |
| Cs | Cesium |
| Ca | Calcium |
| Mg | Magnesium |
| E1 | (dibenzacridine structure) |

As can be seen from the examples and comparative examples in Table 1 and Table 2, when the electron transport layer provided by the embodiments of the present disclosure selected the scheme that the host material (A1-A6) having a pyridine ring and a conjugated ring conjugated thereto is coordinated with a metal element (e.g., Examples 1-12), the voltage can be reduced to 5.05V or less, the external quantum efficiency EQE was 4.45% or more, and the E/CIE-y (current efficiency/color coordinates) was 39 or more, especially when doped with metal ytterbium, the voltage of which was 4.0V or less. On the contrary, in the comparative example 1, when no metal element was doped, the voltage of which was 5.82 V, which was higher than that in the scheme of Example 1 and Example 2 that a metal element was doped. On the contrary, in the Comparative Examples 2, 3 and Comparative Examples 4, 5 and Comparative Examples 6, 7, the host materials B1, C1, and D1 used therein did not satisfy the requirement of "having at least one pyridyl group

and an aromatic group conjugated to the at least one pyridyl group" as described in the present disclosure. As can be seen from the test results, compared with the examples, the voltage of the OLED device obtained in the comparative example was higher, the external quantum efficiency was lower, and the ratio of the current efficiency to the color coordinate was not high, thus it can be seen that by coordinating the host materials described in the present disclosure with the metal elements, a lower voltage and a higher external quantum efficiency EQE and E/CIE-y can be achieve for the OLED device. On the contrary, in the Comparative Example 8, the host material E1 having at least one pyridyl group

and an aromatic group conjugated to the at least one pyridyl group was used therein, but the Tg temperature of this material was below 90° C., thus it had poor film forming property, and the obtained device decayed seriously and the stability of the device was poor. As can be seen from Examples 2-5, the doping amount of the metal ytterbium can be selected between 0.1% and 10%, the voltage can be reduced to 4.00 V or less, the EQE can be increased to 5.00% or more, and the E/CIE-y can be increased to 40 or more. As can be seen from Examples 1-12, the alkali metal, the alkaline earth metal and the rare earth metal elements can be coordinated with the host material to achieve the purpose of improving the luminous efficiency and lifetime of the organic photoelectronic device and reducing its voltage.

Applicant has stated that although the detailed process equipment and process flow of the present disclosure have been described by the above embodiments in the present disclosure, the present invention is not limited thereto. That is to say, it is not meant that the present invention has to be implemented depending on the above detailed process equipment and process flow. It will be apparent to those skilled in the art that any improvements made to the present invention, equivalent replacements to the raw materials of the products of the present invention and addition of adjuvant ingredients, and selections of the specific implementations, etc., all fall within the protection scope and the disclosure scope of the present disclosure.

The invention claimed is:
1. An OLED display panel, comprising a first electrode and a second electrode, a light emitting layer and a first auxiliary light emitting layer disposed between the first electrode and the second electrode, the first auxiliary light emitting layer is disposed between the light emitting layer and the second electrode, wherein the first auxiliary light emitting layer at least includes a first electron-type auxiliary light emitting layer, wherein the first electron-type auxiliary light emitting layer includes a host material and a metal element doped in the host material;

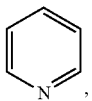

the host material has at least one pyridyl group and an aromatic group conjugated to the at least one pyridyl group;

and the glass transition temperature of the host material is ≥90° C.;

wherein the OLED display panel further comprises a second auxiliary light emitting layer disposed between the first electrode and the light emitting layer.

2. The OLED display panel according to claim 1, wherein the host material has at least one pyridyl group

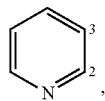

and a conjugated ring sharing carbon atoms at positions 2 and 3 with the at least one pyridyl group.

3. The OLED display panel according to claim 1, wherein the host material has a structure of formula (A):

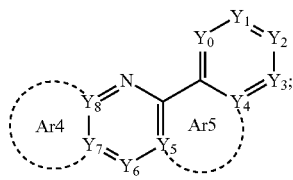

formula (A)

in formula (A), $Y_0$ is selected from N or unsubstituted —CH;

$Y_6$ is selected from C having the following substituent: a substituted or unsubstituted C1-C20 alkyl group, a substituted or unsubstituted C1-C20 heteroalkyl group, a substituted or unsubstituted C6-C40 aryl group, or a substituted or unsubstituted C5-C40 heteroaryl group;

$Y_1$, $Y_2$, $Y_3$, $Y_4$, $Y_5$, $Y_7$, and $Y_8$ are independently optionally selected from any one of N, unsubstituted C or C having the following substituent:

any one of halogen, —CN, —CH$_3$, —COOR$_1$, —COR$_2$,

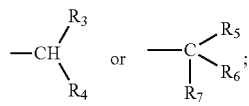

wherein, $R_1$, $R_2$, $R_3$, $R_4$, $R_5$, and $R_6$ are each independently optionally selected from any one of a substituted or unsubstituted C1-C20 alkyl, a substituted or unsubstituted C3-C20 cycloalkyl, a substituted or unsubstituted C6-C40 aryl, a substituted or unsubstituted C5-C40 heteroaryl group, a substituted or unsubstituted C1-C20 alkoxy group, or a substituted or unsubstituted C6-C40 aryloxy group;

Ar$_5$ is absent or selected from any substituted or unsubstituted conjugated ring;

Ar$_4$ is absent or selected from any substituted or unsubstituted conjugated ring.

4. The OLED display panel according to claim 3, wherein in formula (A), $Y_6$ is selected from C having the following substituent: any one of a substituted or unsubstituted phenyl, a substituted or unsubstituted diphenyl, a substituted or unsubstituted terphenyl, a substituted or unsubstituted quaterphenyl, a substituted or unsubstituted quinquephenyl, a substituted or unsubstituted naphthyl, a substituted or unsubstituted anthryl, a substituted or unsubstituted phenanthryl, a substituted or unsubstituted indenyl, a substituted or unsubstituted fluorenyl, a substituted or unsubstituted pyrenyl, or a substituted or unsubstituted benzopyrenyl group.

5. The OLED display panel according to claim 1, wherein the host material has a structure of formula (I):

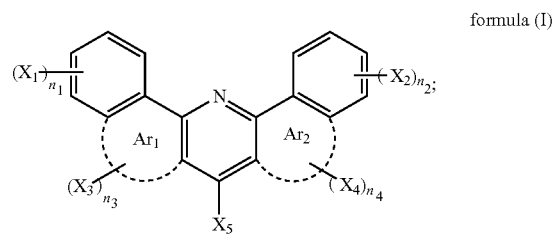

formula (I)

in formula (I), $X_1$, $X_2$, $X_3$, $X_4$, and $X_5$ are each independently selected from hydrogen, halogen, —CN, —CH$_3$, —COOR$_1$, —COR$_2$,

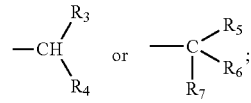

and $X_1$, $X_2$, $X_3$, $X_4$, and $X_5$ include at least one non-hydrogen group; wherein, $R_1$, $R_2$, $R_3$, $R_4$, $R_5$, and $R_6$ are each independently optionally selected from any one of a substituted or unsubstituted C1-C20 alkyl, a substituted or unsubstituted C3-C20 cycloalkyl, a substituted or unsubstituted C6-C40 aryl, a substituted or unsubstituted C5-C40 heteroaryl group, a substituted or unsubstituted C1-C20 alkoxy group, or a substituted or unsubstituted C6-C40 aryloxy group;

$n_1$, $n_2$, $n_3$, and $n_4$ are each independently selected from a positive integer greater than or equal to 0;

Ar$_1$ and Ar$_2$ are each independently selected from a substituted or unsubstituted aromatic five-membered ring, or a substituted or unsubstituted aromatic six-membered ring.

6. The OLED display panel according to claim 1, wherein the host material has a structure of formula (II):

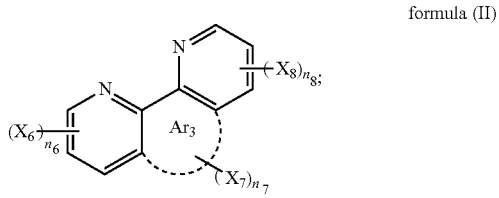

formula (II)

in formula (II), $X_6$, $X_7$, and $X_8$ are each independently selected from hydrogen, halogen, —CN, —CH$_3$, —COOR$_1$, —COR$_2$,

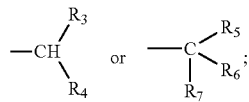

and $X_6$, $X_7$, and $X_8$ include at least one non-hydrogen group; wherein, $R_1$, $R_2$, $R_3$, $R_4$, $R_5$, and $R_6$ are each independently optionally selected from any one of a substituted or unsubstituted C1-C20 alkyl, a substituted or unsubstituted C3-C20 cycloalkyl, a substituted or unsubstituted C6-C40 aryl, a substituted or unsubstituted C5-C40 heteroaryl group, a substituted or unsubstituted C1-C20 alkoxy group, or a substituted or unsubstituted C6-C40 aryloxy group;

$n_8$, $n_6$, and $n_7$ are each independently selected from a positive integer greater than or equal to 0;

Ar$_3$ is absent or selected from a substituted or unsubstituted aromatic five-membered ring, or a substituted or unsubstituted aromatic six-membered ring.

7. The OLED display panel according to claim 1, wherein the host material has a glass transition temperature ≥120° C.

8. The OLED display panel according to claim 1, wherein the metal element includes an alkali metal element, an alkaline earth metal element and a rare earth metal element.

9. The OLED display panel according to claim 1, wherein the metal element includes any one or a combination of at least two of ytterbium, magnesium, lithium, cesium and calcium.

10. The OLED display panel according to claim 1, wherein in the first electron-type auxiliary light emitting layer, the volume ratio of the doped metal element to the host material is 0.1-10%.

11. The OLED display panel according to claim 1, wherein in the first electron-type auxiliary light emitting layer, the volume ratio of the doped metal element to the host material is 0.5-5%.

12. The OLED display panel according to claim 1, wherein the light emitting layer includes any one or a combination of at least two of a blue light emitting unit, a green light emitting unit, a red light emitting unit, a yellow light emitting unit, and a white light emitting unit.

13. The OLED display panel according to claim 1, wherein the light emitting material of the green light emitting unit and the red light emitting unit is a phosphorescent material;

and the light emitting material of the blue light emitting unit is a fluorescent material.

14. The OLED display panel according to claim 1, wherein the blue light emitting unit, the green light emitting unit and the red light emitting unit are each independently selected from a manner that a host material is doped with a guest material.

15. The OLED display panel according to claim 14, wherein the red light emitting unit includes one or two host materials; the green light emitting unit includes two or more host materials; and the blue light emitting unit includes one or two host materials.

16. The OLED display panel according to claim 1, wherein the second electrode employs any one of magnesium silver alloy, silver metal, silver ytterbium alloy and silver rare-earth metal alloy.

17. An electronic device, comprising an OLED display panel, wherein the OLED display panel comprises a first electrode and a second electrode, a light emitting layer and a first auxiliary light emitting layer disposed between the first electrode and the second electrode, the first auxiliary light emitting layer is disposed between the light emitting layer and the second electrode, wherein the first auxiliary light emitting layer at least includes a first electron-type auxiliary light emitting layer, wherein the first electron-type auxiliary light emitting layer includes a host material and a metal element doped in the host material;

the host material has at least one pyridyl group

and an aromatic group conjugated to the at least one pyridyl group;

and the glass transition temperature of the host material is ≥90° C.;

wherein the OLED display panel further comprises a second auxiliary light emitting layer disposed between the first electrode and the light emitting layer.

* * * * *